United States Patent
Parthasarathy et al.

(10) Patent No.: US 9,660,053 B2
(45) Date of Patent: May 23, 2017

(54) HIGH-VOLTAGE FIELD-EFFECT TRANSISTOR HAVING MULTIPLE IMPLANTED LAYERS

(71) Applicant: Power Integrations, Inc., San Jose, CA (US)

(72) Inventors: Vijay Parthasarathy, Sunnyvale, CA (US); Sujit Banerjee, San Jose, CA (US)

(73) Assignee: Power Integrations, Inc., San Jose, CA (US)

(*) Notice: Subject to any disclaimer, the term of this patent is extended or adjusted under 35 U.S.C. 154(b) by 0 days.

(21) Appl. No.: 13/941,119

(22) Filed: Jul. 12, 2013

(65) Prior Publication Data

US 2015/0014770 A1    Jan. 15, 2015

(51) Int. Cl.
*H01L 29/06* (2006.01)
*H01L 29/10* (2006.01)
(Continued)

(52) U.S. Cl.
CPC .... *H01L 29/66659* (2013.01); *H01L 21/2652* (2013.01); *H01L 21/26586* (2013.01); *H01L 29/0634* (2013.01); *H01L 29/7835* (2013.01); *H01L 29/402* (2013.01); *H01L 29/42368* (2013.01)

(58) Field of Classification Search
CPC ......... H01L 29/06; H01L 29/10; H01L 29/66; H01L 29/78
USPC ........ 257/339, 342, 378; 438/286, 301, 306, 438/430, 527, 270, 138
See application file for complete search history.

(56) References Cited

U.S. PATENT DOCUMENTS 4,454,648 A * 6/1984 Hsia .............................. 438/216
4,462,041 A   7/1984 Glenn
(Continued)

FOREIGN PATENT DOCUMENTS

DE    4309764 A1   9/1994
JP    56-38867 A   4/1981
(Continued)

OTHER PUBLICATIONS

Appels et al., "High Voltage Thin Layer Devices (RESURF Devices)", IEDM Tech. Digest, 1979, pp. 238-241.
(Continued)

*Primary Examiner* — Sheng Zhu
(74) *Attorney, Agent, or Firm* — Blakely Sokoloff Taylor & Zafman LLP

(57) ABSTRACT

A method for fabricating a high-voltage field-effect transistor includes forming a body region, a source region, and a drain region in a semiconductor substrate. The drain region is separated from the source region by the body region. Forming the drain region includes forming an oxide layer on a surface of the semiconductor substrate over the drain region and performing a plurality of ion implantation operations through the oxide layer while tilting the semiconductor substrate such that ion beams impinge on the oxide layer at an angle that is offset from perpendicular. The plurality of ion implantation operations form a corresponding plurality of separate implanted layers within the drain region. Each of the implanted layers is formed at a different depth within the drain region.

19 Claims, 6 Drawing Sheets

(51) Int. Cl.
H01L 29/66 (2006.01)
H01L 29/78 (2006.01)
H01L 21/265 (2006.01)
*H01L 29/40* (2006.01)
*H01L 29/423* (2006.01)

(56) References Cited

U.S. PATENT DOCUMENTS

| | | | |
|---|---|---|---|
| 4,503,601 A * | 3/1985 | Chiao | 438/303 |
| 4,618,541 A | 10/1986 | Forouhi et al. | |
| 4,626,879 A | 12/1986 | Colak | |
| 4,663,830 A | 5/1987 | Braunig et al. | |
| 4,665,426 A | 5/1987 | Allen et al. | |
| 4,754,310 A | 6/1988 | Coe | |
| 4,764,800 A | 8/1988 | Sander | |
| 4,811,075 A | 3/1989 | Eklund | |
| 4,890,146 A | 12/1989 | Williams et al. | |
| 4,894,694 A | 1/1990 | Cham et al. | |
| 4,922,327 A | 5/1990 | Mena et al. | |
| 4,950,977 A * | 8/1990 | Garcia et al. | 324/71.1 |
| 5,010,024 A | 4/1991 | Allen et al. | |
| 5,025,296 A | 6/1991 | Fullerton et al. | |
| 5,040,045 A | 8/1991 | McArthur et al. | |
| 5,068,700 A | 11/1991 | Yamaguchi et al. | |
| 5,146,298 A | 9/1992 | Eklund | |
| 5,155,574 A | 10/1992 | Yamaguchi | |
| 5,237,193 A | 8/1993 | Williams et al. | |
| 5,258,636 A | 11/1993 | Rumennik et al. | |
| 5,270,226 A * | 12/1993 | Hori et al. | 438/302 |
| 5,270,264 A | 12/1993 | Andideh et al. | |
| 5,313,082 A | 5/1994 | Eklund | |
| 5,324,683 A | 6/1994 | Fitch et al. | |
| 5,349,225 A | 9/1994 | Redwine et al. | |
| 5,359,221 A | 10/1994 | Miyamoto et al. | |
| 5,386,136 A | 1/1995 | Williams et al. | |
| 5,438,215 A | 8/1995 | Tihanyi | |
| 5,521,105 A | 5/1996 | Hsu et al. | |
| 5,550,405 A | 8/1996 | Cheung et al. | |
| 5,654,206 A | 8/1997 | Merrill et al. | |
| 5,656,543 A | 8/1997 | Chung | |
| 5,659,201 A | 8/1997 | Wollesen | |
| 5,663,599 A | 9/1997 | Lur | |
| 5,670,828 A | 9/1997 | Cheung et al. | |
| 5,679,608 A | 10/1997 | Cheung et al. | |
| 5,716,887 A | 2/1998 | Kim | |
| 5,726,469 A | 3/1998 | Chen | |
| 5,843,817 A * | 12/1998 | Lee et al. | 438/239 |
| 5,943,595 A | 8/1999 | Akiyama et al. | |
| 6,010,926 A | 1/2000 | Rho et al. | |
| 6,168,983 B1 * | 1/2001 | Rumennik et al. | 438/188 |
| 6,174,758 B1 * | 1/2001 | Nachumovsky | 438/199 |
| 6,184,555 B1 | 2/2001 | Tihanyi et al. | |
| 6,429,077 B1 * | 8/2002 | Tung | 438/270 |
| 6,489,224 B1 * | 12/2002 | Burr | 438/526 |
| 6,724,041 B2 * | 4/2004 | Rumennik et al. | 257/336 |
| 6,773,997 B2 * | 8/2004 | Imam et al. | 438/286 |
| 7,008,865 B2 * | 3/2006 | Uno | 438/527 |
| 7,011,998 B1 | 3/2006 | Ju et al. | |
| 7,078,295 B2 * | 7/2006 | Jeon et al. | 438/261 |
| 2004/0036115 A1 | 2/2004 | Disney | |
| 2008/0093641 A1 | 4/2008 | Ludikhuize et al. | |
| 2008/0185593 A1 | 8/2008 | Saggio et al. | |
| 2010/0140701 A1 | 6/2010 | Kim | |

FOREIGN PATENT DOCUMENTS

| | | |
|---|---|---|
| JP | 57-12557 A | 1/1982 |
| JP | 57-12558 A | 1/1982 |
| JP | 60-64771 A | 4/1985 |
| JP | 4-107867 A | 4/1992 |
| JP | 4-107877 A | 4/1992 |
| JP | 6-224426 A | 8/1994 |
| JP | 7-283409 A | 10/1995 |
| WO | 98/20562 A1 | 5/1998 |

OTHER PUBLICATIONS

Fujihira, Tatsuhiko, "Theory of Semiconductor Superjunction Devices", Japanese Journal of Applied Physics, vol. 36, Part 1, No. 10, Oct. 1997, pp. 6254-6262.

Shieh et al., "Air-Gap Formation During IMD Deposition to Lower Interconnect Capacitance", IEEE Electron Device Letters, vol. 19, No. 1, Jan. 1998, pp. 16-18.

Tamba et al., "Characteristics of Bipolar Transistors with Various Depth n + Buried Layers Formed by High Energy Ion Implantation", Extended Abstracts of the 20th (1988 International) Conference on Solid State Devices and Materials, 1988, pp. 141-144.

Amato, M., "Reduced Electric Field Crowding at the Fingertips of Lateral DMOS Transistors", Proceedings of the Electrochemical Society Meeting, May 1989, pp. 161-162.

Yilmaz, Hamza, "Modeling and Optimization of Lateral High Voltage IC Devices to Minimize 3-D Effects", R&D Engineering, Semiconductor Business Division, General Electric Company, NC, pp. 290-294.

Yilmaz, Hamza, "Modeling and Optimizing of Lateral High Voltage IC Devices to Minimize 3-D Effects", Proceedings of the Electrochemical Society Meeting, May 1989, pp. 155-156.

International Search Report & Written Opinion received for PCT Patent Application No. PCT/US2014/044769, mailed on Oct. 23, 2014, 16 pages.

* cited by examiner

US 9,660,053 B2

HIGH-VOLTAGE FIELD-EFFECT TRANSISTOR HAVING MULTIPLE IMPLANTED LAYERS

BACKGROUND INFORMATION

Field of the Disclosure

The disclosure relates to fabrication of field-effect transistors, and more particularly, to fabrication of high-voltage field-effect transistors.

Background

High-voltage field-effect transistors (HVFETs) may be used in a variety of different circuit applications, such as power conversion circuits. For example, a HVFET may be used as a power switch in a power conversion circuit. Example power converter topologies including a HVFET power switch may include, but are not limited to, non-isolated power converter topologies (e.g., a buck converter or boost converter) and isolated power converter topologies (e.g., a flyback converter).

A HVFET may be subjected to high voltages and currents during operation in a power conversion circuit. For example, HVFETs may be subjected to hundreds of volts (e.g., 700-800 V) during operation. Accordingly, HVFETs may be designed to have high breakdown voltages. HVFETs may also be designed to have a relatively low ON resistance in order to minimize conduction losses during operation of the power conversion circuit.

BRIEF DESCRIPTION OF THE DRAWINGS

Non-limiting and non-exhaustive embodiments of the present disclosure are described with reference to the following figures, wherein like reference numerals may refer to like parts throughout the various views.

Figure 1:
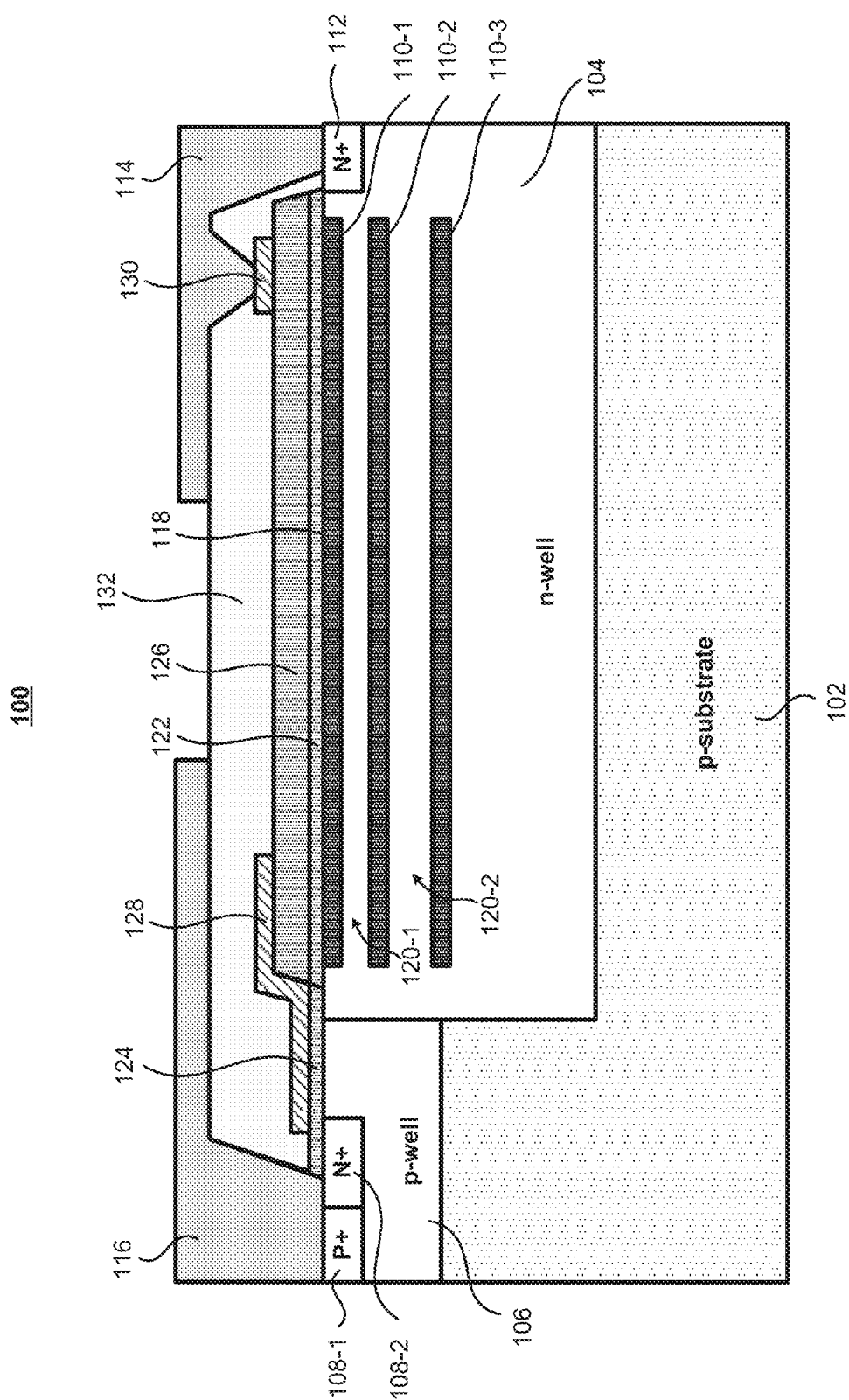
FIG. 1 shows a cross-sectional side view of a high-voltage field-effect transistor (HVFET).

Corresponding reference numerals may indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in commercially feasible embodiments are often not depicted in order to facilitate a less obstructed view of the various embodiments of the present disclosure.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures, or characteristics may be combined in any suitable combinations and/or subcombinations in one or more embodiments or examples.

A high-voltage field-effect transistor (HVFET) of the present disclosure may be fabricated on a substrate (e.g., a doped silicon substrate). In general, the processing operations used to form the HVFET may be performed on a surface of the substrate. For example, doping operations, patterning operations, and layering operations used to fabricate the HVFET may be performed on the surface of the substrate.

The HVFET includes a drain region (e.g., drain region 104 of FIG. 1), a source region (e.g., source region 108 of FIG. 1), and a body region (e.g., body region 106 of FIG. 1) formed in the substrate. The drain region and the source region may be separated from one another by the body region. The drain region may include a doped region (e.g., an n-well) formed in the substrate. The body region may be a doped region (e.g., a p-well) formed in the substrate adjacent the drain region. The source region may be a doped region (e.g., P+ and N+ doped regions) formed within the body region such that a portion of the body region is disposed between the source region and the drain region.

A variety of different layers may be formed over the surface of the substrate. A gate oxide layer and gate electrode may be formed over top of the portion of the body region disposed between the source region and the drain region. The portion of the body region under the gate electrode and gate oxide may form a channel region of the HVFET. Source and drain electrodes may also be formed to provide contacts for the source and drain regions.

The HVFET of the present disclosure may also include a thin oxide layer that is formed over the drain region. The thin oxide layer may be present during fabrication of features included in the drain region (e.g., implanted layers 110). The thin oxide layer may also be present in the final HVFET, as illustrated in FIG. 1. The structure and fabrication of the drain region is described hereinafter.

The drain region of the HVFET includes a plurality of implanted layers (e.g., implanted layers 110-1, 110-2, 110-3 of FIG. 1). As described herein, the implanted layers may be p-doped regions within the n-well of the drain region. Each implanted layer may have a planar geometry that is approximately parallel to the surface of the substrate. Accordingly, the implanted layers may be approximately parallel with one another. The implanted layers may be formed at different depths within the drain region such that the implanted layers are stacked above or below one another. The implanted p-type layers may be separated from one another by n-type regions of the drain region.

The three implanted layers may be referred to as a top implanted layer, a middle implanted layer, and a bottom implanted layer. In some examples, the top implanted layer may be formed at the surface of the substrate (e.g., see FIG. 1). In other examples (e.g., see FIG. 8), the top implanted layer may be formed a distance below the surface of the substrate such that an n-type portion of the drain region is disposed between the top implanted layer and the surface of the substrate. The middle implanted layer may be formed under the top implanted layer and separated from the top implanted layer by a region of the n-well. The bottom implanted layer may be formed under the middle implanted layer and separated from the middle implanted layer by a region of the n-well.

The three implanted layers may be implanted in the drain region using ion implantation operations. In general, an ion implantation operation may involve emitting an ion beam of a selected energy at the substrate to implant one of the implanted layers. As described hereinafter (e.g., with respect to FIG. 5), the three implanted layers may be implanted through a thin oxide layer formed on the surface of the substrate. Implantation through the thin oxide layer may aid in producing implanted layers having a gaussian distribution doping profile. In some examples, the substrate may be tilted during an ion implantation operation such that the ion beam does not impinge on the thin oxide layer perpendicularly. For example, the substrate may be tilted such that the ion beam impinges on the thin oxide layer at an angle that is approximately 3-10 degrees off from perpendicular. Implantation while the substrate is tilted may also aid in producing implanted layers having a gaussian distribution doping profile.

Figure 8:
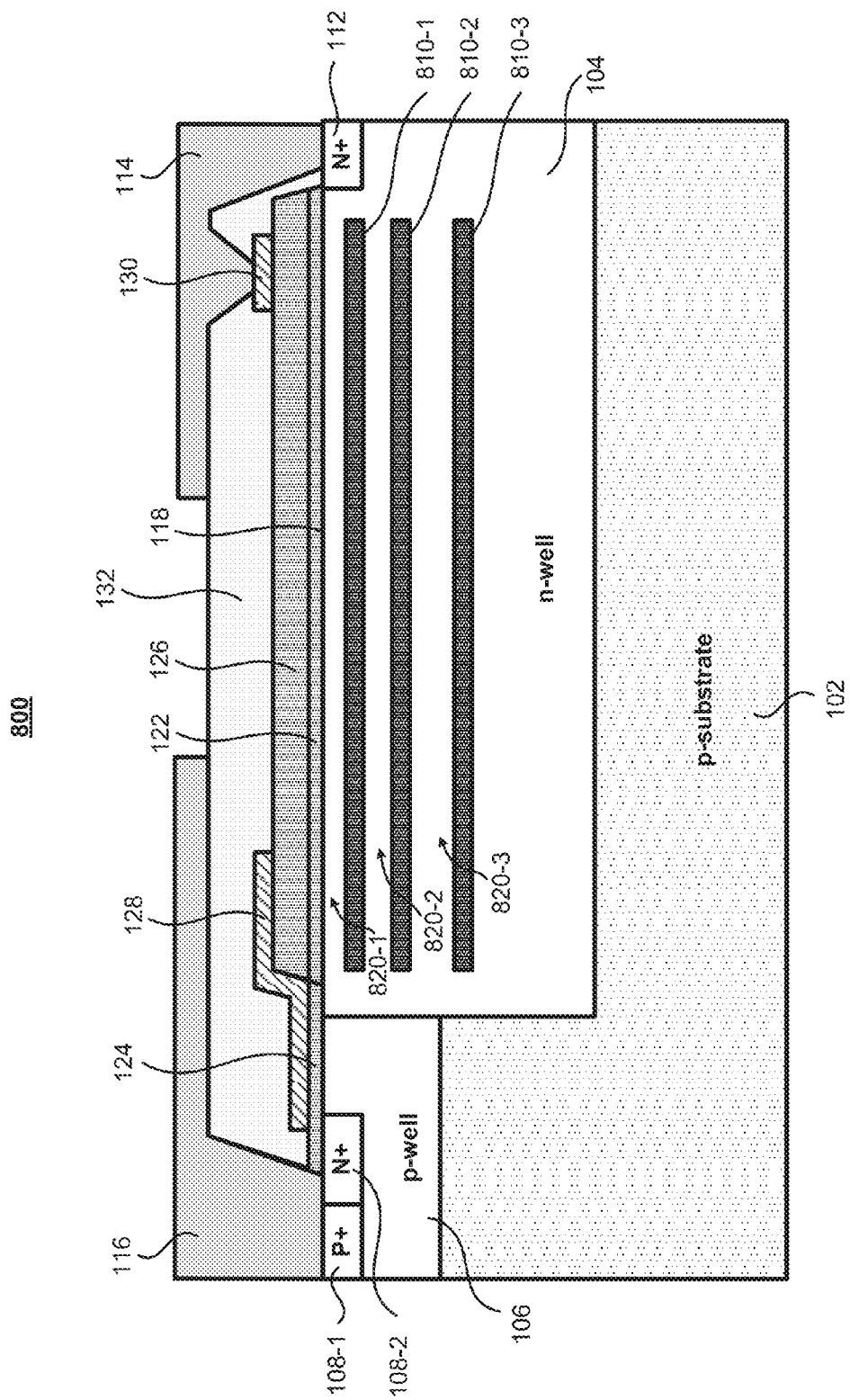
FIG. 8 shows a cross-sectional side view of an alternative HVFET.

The thin oxide layer over top of the drain region may be left over the drain region during subsequent processing operations. For example, additional layers (e.g., insulators and electrodes) may be built up on top of the thin oxide layer during subsequent processing operations. In some examples, the thin oxide layer may be present in a finished HVFET device, as illustrated in FIG. 1 and FIG. 8.

Figure 2:
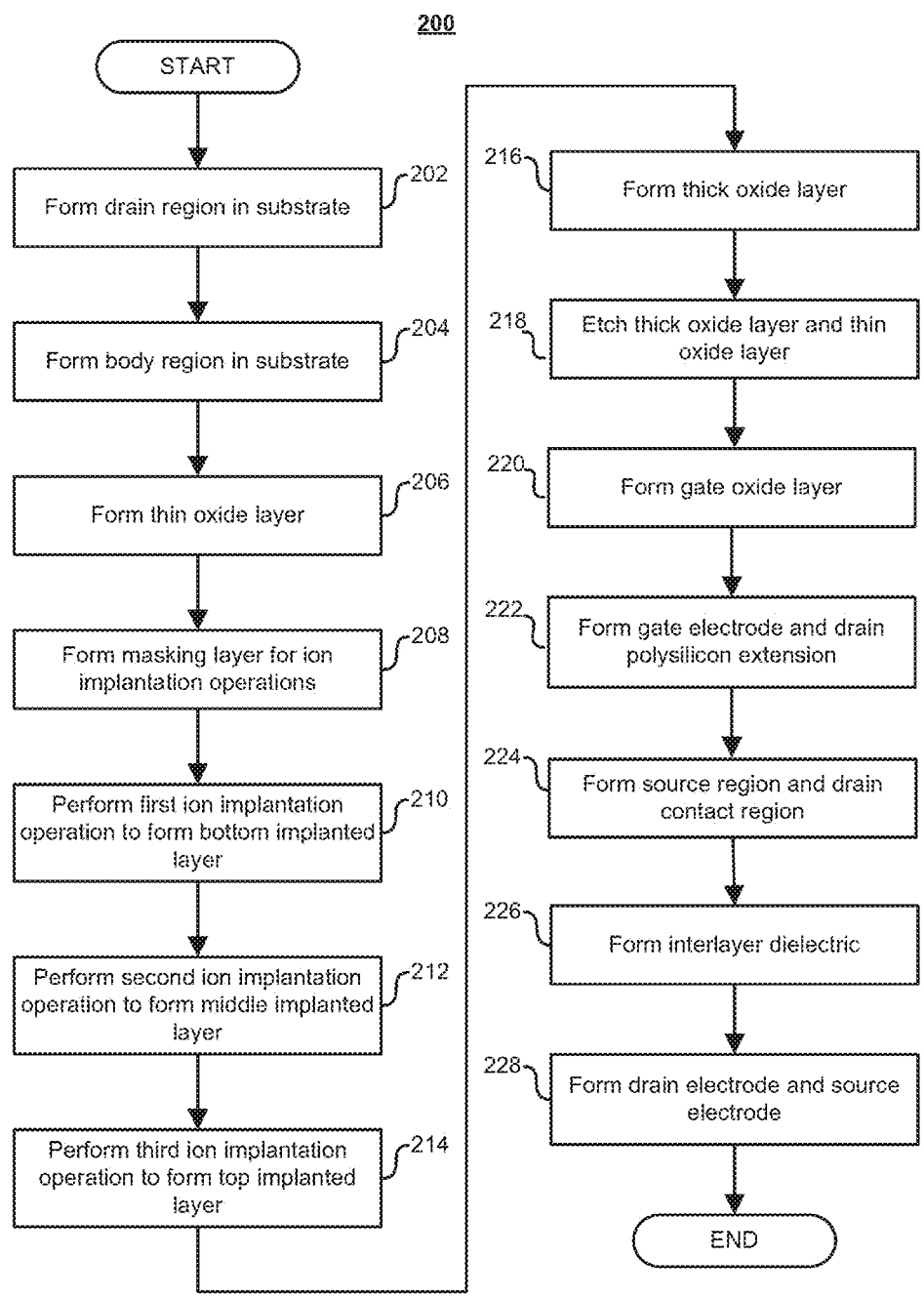
FIG. 2 is a flow diagram that describes fabrication of the HVFET of FIG. 1.

Example HVFETs and fabrication of the example HVFETs is now described with reference to FIGS. 1-8. FIG. 1 and FIG. 8 show example HVFETs. FIG. 2 shows an example method for fabricating HVFETs. FIGS. 3-7 show various phases of HVFET fabrication, as described in the method of FIG. 2.

FIG. 1 is a cross-sectional side view of a HVFET 100 of the present disclosure. HVFET 100 may be used in a variety of different electronic applications. For example, HVFET 100 may be used as a power switch in a switched mode power supply circuit. In one example the HVFET 100 may be for applications with rating voltage 700 Volt, rating current 5 Ampere and $R_{DSON}$ of 1 Ohm.

HVFET 100 includes a p-type semiconductor substrate 102. For example, p-type semiconductor substrate 102 may be a p-doped silicon wafer. P-type semiconductor substrate 102 may be referred to hereinafter as "substrate 102." Substrate 102 includes a drain region 104, a body region 106, and a source region 108. Source region 108 may refer to the combination of P+ region 108-1 and N+ region 108-2. A portion of body region 106 is located between drain region 104 and source region 108.

Drain region 104 is formed within substrate 102. For example, drain region 104 may be an n-well formed within substrate 102. Drain region 104 includes three implanted layers 110-1, 110-2, and 110-3 (collectively "implanted layers 110"). Drain region 104 may also include a drain contact region 112. Drain contact region 112 may be a heavily n-doped (N+) region within drain region 104. Drain contact region 112 may be contacted by a drain electrode 114. Drain electrode 114 may serve as a drain terminal of HVFET 100 which may be connected to circuitry external to HVFET 100. In some examples, drain electrode 114 may be a metallic electrode.

Body region 106 is formed within substrate 102 adjacent drain region 104. For example, body region 106 may be a doped region (e.g., a p-well) formed in substrate 102 adjacent drain region 104. In some examples, body region 106 may abut (e.g., interface with) drain region 104.

Source region 108 may include one or more doped regions within body region 106. For example, source region 108 may include a heavily p-doped (P+) region 108-1 and a heavily n-doped (N+) region 108-2 formed within body region 106. Source region 108 is separated from drain region 104 by body region 106. For example, source region 108 is formed within body region 106 such that a portion of body region 106 is disposed between source region 108 and drain region 104. The portion of body region 106 disposed between source region 108 and drain region 104 may include a portion of the "channel region" of HVFET 100. Source region 108 may be contacted by a source electrode 116. Source electrode 116 may serve as a source terminal of HVFET 100 which may be connected to circuitry external to HVFET 100. In some examples, source electrode 116 may be a metallic electrode.

As described above, drain region 104 may include three implanted layers 110. Although three implanted layers 110 are illustrated and described herein, it is contemplated that additional implanted layers may be formed in drain region 104 according to the techniques of the present disclosure. Implanted layer 110-1 may be referred to herein as a "top implanted layer 110-1." Implanted layer 110-2 may be referred to herein as a "middle implanted layer 110-2." Implanted layer 110-3 may be referred to herein as a "bottom implanted layer 110-3."

Implanted layers 110 may be p-doped regions (e.g., using boron) within drain region 104. Implanted layers 110 may be implanted within drain region 104 using ion implantation operations described herein. Each of implanted layers 110 may have approximately planar geometries that extend within drain region 104 approximately parallel to surface 118. Accordingly, implanted layers 110 may be visualized as p-doped layers within drain region 104 that are approximately parallel with surface 118 and parallel with one another.

Implanted layers 110 may be formed at different depths within drain region 104 such that implanted layers 110 are stacked above and below one another. Implanted layers 110 may be separated from one another by regions the n-well that are not p-doped by the ion implantation operations. In other words, implanted layers 110 may be formed in drain region 104 such that implanted layers 110 are separated by n-doped regions 120-1, 120-2 of drain region 104.

Top implanted layer 110-1 may be separated from middle implanted layer 110-2 by n-doped region 120-1. Put another way, n-doped region 120-1 may be disposed between top implanted layer 110-1 and middle implanted layer 110-2 and may extend along the lengths of top implanted layer 110-1 and middle implanted layer 110-2. Middle implanted layer 110-2 may be separated from bottom implanted layer 110-3 by n-doped region 120-2. In other words, n-doped region 120-2 may be disposed between middle implanted layer 110-2 and bottom implanted layer 110-3 and may extend along the lengths of middle implanted layer 110-2 and bottom implanted layer 110-3.

In HVFET 100 of FIG. 1, top implanted layer 110-1 may be formed at surface 118. In other examples, e.g., with respect to FIG. 8, top implanted layer 810-1 may be formed below surface 118 of substrate 102 such that an n-doped region 820-1 is disposed between top implanted layer 810-1 and surface 118.

Implanted layers 110 may extend in a direction that is parallel to surface 118. As illustrated herein, in some examples, implanted layers 110 may extend from a portion of drain region 104 that is near drain contact region 112 to a portion of drain region 104 that is near body region 106. However, as illustrated in FIG. 1, implanted layers 110 may not contact drain contact region 112 and body region 106 in some examples. Instead, in these examples, an n-doped region of drain region 104 may separate implanted layers 110 from drain contact region 112. Similarly, an n-doped region of drain region 104 may separate implanted layers 110 from body region 106. Put another way, edges of implanted layers 110 near drain contact region 112 are separated from drain contact region 112 by an n-doped region of drain region 104. Similarly, edges of implanted layers 110 near body region 106 are separated from body region 106 by an n-doped region of drain region 104.

In the example HVFET 100 of FIG. 1, middle implanted layer 110-2 and bottom implanted layer 110-3 may be surrounded by n-doped regions of drain region 104. Top implanted layer 110-1 is surrounded by n-doped regions of drain region 104 an all sides except for the side of top implanted layer 110-1 at surface 118. The side of top implanted layer 110-1 at surface 118 may abut thin oxide layer 122. In the example HVFET 800 of FIG. 8, each of implanted layers 810 may be surrounded by n-doped regions of drain region 104.

HVFET 100 includes a thin oxide layer 122, a gate oxide layer 124, and a thick oxide layer 126. Thin oxide layer 122 may be formed on surface 118 over top of implanted layers 110. For example, thin oxide layer 122 may completely cover the portion of surface 118 over top of implanted layers 110. As described hereinafter, thin oxide layer 122 may be formed on surface 118 prior to implantation of implanted layers 110. After formation of thin oxide layer 122, implanted layers 110 may be implanted in drain region 104 through thin oxide layer 122 during ion implantation operations.

Gate oxide layer 124 may be formed on surface 118 over top of body region 106. For example, gate oxide layer 124 may cover the portion of body region 106 that is located between drain region 104 and source region 108. As illustrated in FIG. 1, gate oxide layer 124 may be formed adjacent thin oxide layer 122 such that gate oxide layer 124 and thin oxide layer 122 form a continuous oxide layer covering surface 118.

A gate electrode 128 may be formed on top of gate oxide layer 124 over top of body region 106. The portion of body region 106 and drain region 104 under gate oxide layer 124 and gate electrode 128 may form a channel region of HVFET 100. Accordingly, the channel region of HVFET 100 may extend from edges of implanted layers 110 to source region 108 in some examples. Gate electrode 128 may serve as a gate terminal of HVFET 100 which may be connected to circuitry external to HVFET 100. In some examples, gate electrode 128 may be a heavily doped polycrystalline silicon material. Modulating a gate voltage applied at gate electrode 128 may modulate the conductivity of the portion of body region 106 (e.g., the channel region) underlying gate electrode 128 and gate oxide layer 124.

Thick oxide layer 126 may be formed over top of thin oxide layer 122 after implanted layers 110 are formed via ion implantation operations. An edge of thick oxide layer 126 may be located adjacent to an edge of gate oxide layer 124. For example, an interface may be present between an edge of gate oxide layer 124 and an edge of thick oxide layer 126.

As described above, gate electrode 128 is formed over top of gate oxide layer 124. In some examples, as illustrated in FIG. 1, gate electrode 128 may be a continuous layer that is formed over both gate oxide layer 124 and a portion of thick oxide layer 126. For example, gate electrode 128 may conform to the interface between gate oxide layer 124 and thick oxide layer 126 such that a continuous gate electrode 128 is deposited on top of gate oxide layer 124 and on top of a portion of thick oxide layer 126. As illustrated in FIG. 1, gate electrode 128 may be formed on top of thick oxide layer 126 over top of edges of implanted layers 110 that are near body region 106. In some examples, a drain polysilicon extension 130 may be deposited on top of thick oxide layer 126 over top of edges of implanted layers 110 that are near drain contact region 112. Drain polysilicon extension 130 and the portion of gate electrode 128 over top of implanted layers 110 may modify the peak field within the underlying drain region 104.

HVFET 100 may include an interlayer dielectric 132 formed over top of gate oxide layer 124, gate electrode 128, and thick oxide layer 126. Interlayer dielectric 132 may be an insulting material that serves to prevent electrodes (e.g., 114, 116, 128) from contacting one another.

Some of the structure and operation of HVFET 100 is summarized as follows. Drain region 104 and source region 108 are separated by body region 106. Drain region 104 includes a drain contact region 112 which may be contacted with drain electrode 114. Body region 106 includes source region 108 that may be contacted with source electrode 116. A portion of body region 106 and a portion of drain region 104 are located between source region 108 and drain contact region 112. Put another way, drain contact region 112 and source region 108 may be located on separate ends of HVFET 100 such that portions of body region 106 and portions of drain region 104 including implanted layers 110 are located between drain contact region 112 and source region 108. During operation, when HVFET 100 is set into the ON state by a gate voltage, current may flow between drain contact region 112 and source region 108 (e.g., between implanted layers 110) in response to application of a drain to source voltage.

Fabrication of HVFET 100 is described hereinafter. A method 200 for fabricating HVFET 100 is described with respect to FIG. 2. Fabrication of HVFET 100 at various different stages is illustrated in FIGS. 3-7. The method 200 for fabricating HVFET 100 is now described with reference to FIGS. 3-7.

FIG. 2 shows a method 200 for fabricating HVFET 100. As illustrated and described herein, HVFET 100 may be fabricated on a p-type semiconductor substrate 102 (e.g., a p-doped silicon wafer). In one example a lightly p-doped ($5 \times 10^{13}$ cm$^{-3}$ to $5 \times 10^{14}$ cm$^{-3}$) silicon wafer may be used.

Figure 3:
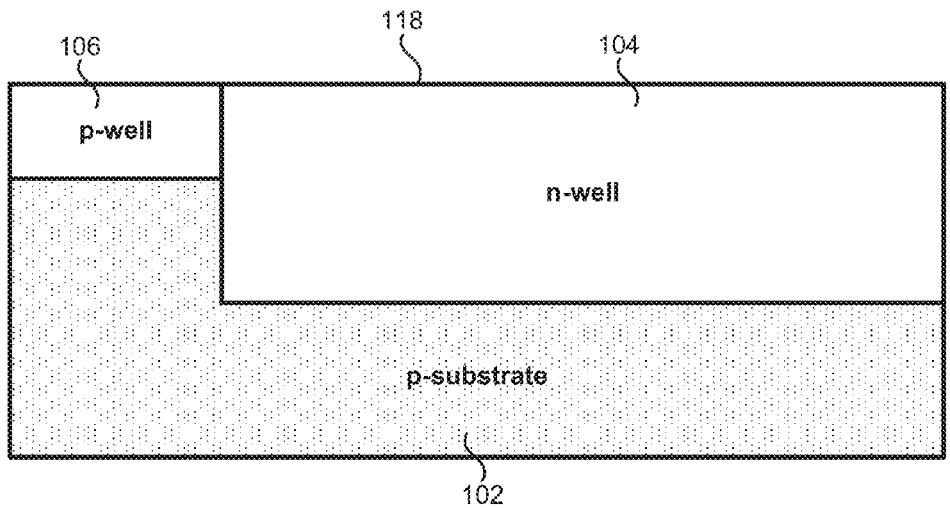
FIG. 3 shows a cross-sectional side view of a substrate including a drain region and a body region of the HVFET of FIG. 1.

With reference to FIG. 3, substrate 102 may have a surface 118 on which processing operations are performed to fabricate HVFET 100. For example, doping operations, patterning operations, and layering operations used to fabricate HVFET 100 may be performed on surface 118 as described hereinafter.

Initially, drain region 104 and body region 106 may be formed in substrate 102 in block 202 and block 204, respectively. Drain region 104 may be an n-well formed in a portion of substrate 102. Body region 106 may be a p-well formed in a portion of substrate 102 adjacent drain region 104.

Drain region 104 and body region 106 may be doped regions that extend from surface 118 into substrate 102. In some examples, drain region 104 may have a depth of approximately 5-10 μm and a length of approximately 20-150 μm. In some examples, body region 106 may have a depth of approximately 1-8 μm.

Figure 4:
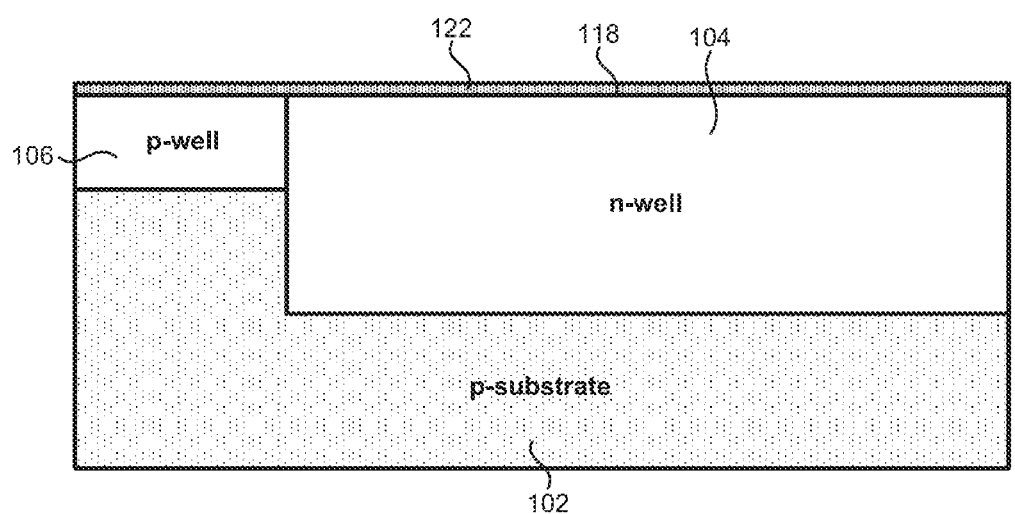
FIG. 4 shows a cross-sectional side view of a substrate including a thin oxide layer.

Referring now to FIG. 4, thin oxide layer 122 may be formed on surface 118 in block 206. As illustrated, thin oxide layer 122 may be formed over both body region 106 and drain region 104. Thin oxide layer 122 may be grown using a thermal oxidation process. In some examples, thin oxide layer 122 may have a thickness of approximately 20-500 nm.

Figure 5:
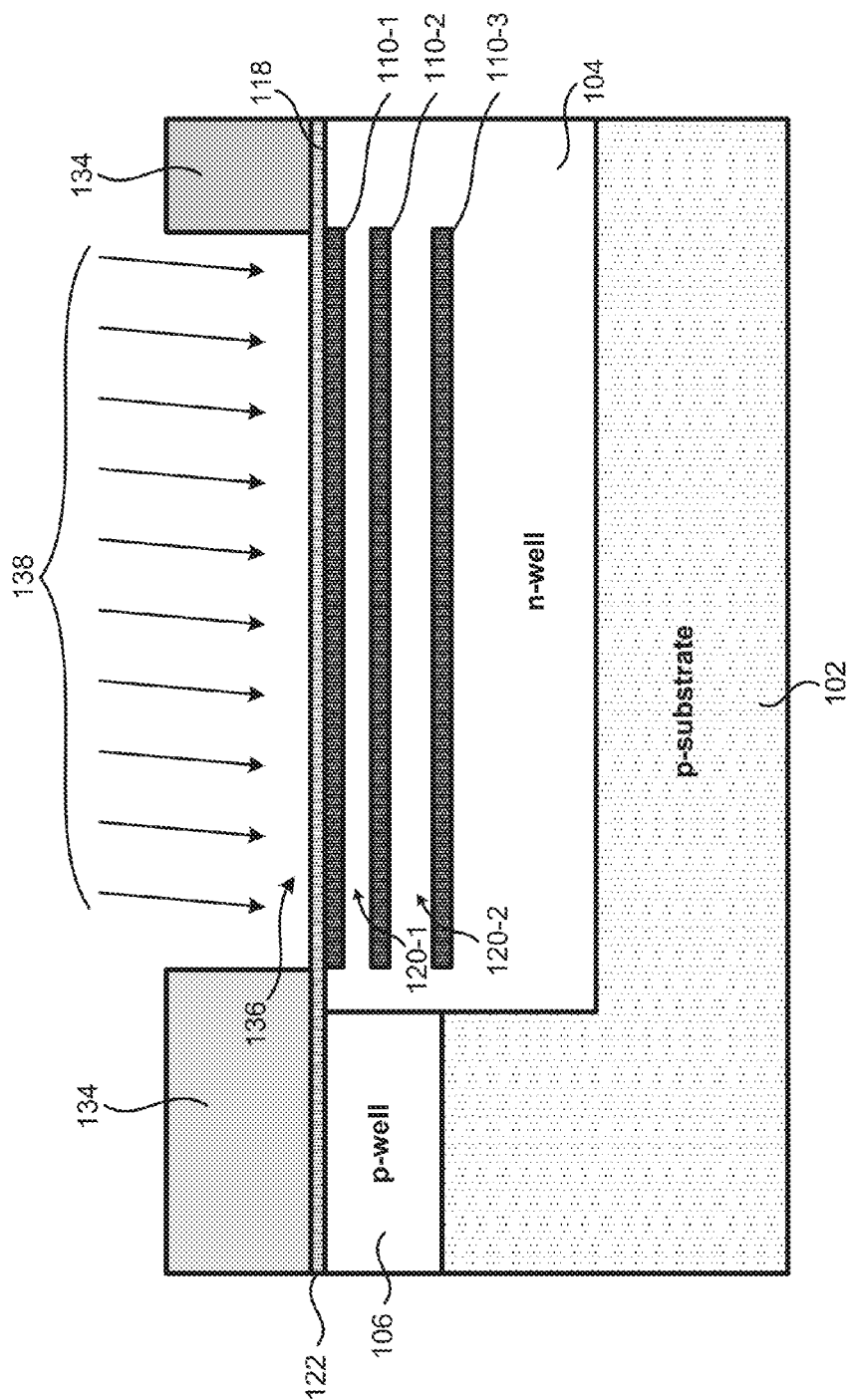
FIG. 5 shows a cross-sectional side view of ion implantation operations used to implant implanted layers of the HVFET of FIG. 1.

Referring now to FIG. 5, masking layer 134 may be formed over top of thin oxide layer 122 in block 208. Masking layer 134 may define an opening 136 over top of a portion of thin oxide layer 122 that is above drain region 104. Subsequent ion implantation operations may be performed through opening 136. Masking layer 134 may be a photoresist layer in some examples. Masking layer 134 may have a sufficient thickness to prevent ions from penetrating into portions of substrate 102 that are masked by masking layer 134.

A plurality of ion implantation operations are then performed through thin oxide layer 122 in blocks 210-214 to form implanted layers 110. The plurality of ion implantation operations are represented by the arrows 138 impinging on thin oxide layer 122. For example, arrows 138 may represent an ion beam impinging on thin oxide layer 122. The angle of arrows 138 may represent the angle of the ion beam with respect to thin oxide layer 122. The angle at which the ion beam impinges on thin oxide layer 122 may be controlled by tilting substrate 102 relative to the ion beam. Although substrate 102 may be tilted during an ion implantation operation such that the ion beam impinges on thin oxide layer 122 at an angle other than 90 degrees (i.e., perpendicular to thin oxide layer 122), in some examples, substrate 102 may be tilted such that the ion beam impinges on thin oxide layer 122 at a 90 degree angle. Arrows 138 are illustrated in FIG. 5 as impinging on thin oxide layer 122 at an angle that is approximately five degrees off from perpendicular.

A single ion implantation operation may be used to implant a single one of implanted layers 110. Accordingly, three separate ion implantation operations may be used to implant the three separate implanted layers 110. Various different parameters (e.g., implantation angle and implantation energy) may be used for each of the three ion implantation operations. Example parameters for the three implantation operations are described below.

A first ion implantation operation may be performed through thin oxide layer 122 to implant bottom implanted layer 110-3 in block 210. In some examples, the first ion implantation operation may be performed while substrate 102 is tilted such that the ion beam impinges on thin oxide layer 122 at an angle other than 90 degrees, i.e., other than perpendicular. For example, substrate 102 may be tilted such that the ion beam impinges on thin oxide layer 122 at an angle that is approximately 3-10 degrees off from perpendicular. The first ion implantation operation may be performed using an ion implantation energy of approximately 2 MeV-5 MeV in some examples. Performing ion implantation through thin oxide layer 122 while tilting substrate 102, as described above, may result in bottom implanted layer 110-3 having an approximately gaussian distribution doping profile.

Bottom implanted layer 110-3 may be implanted in substrate 102 (i.e., drain region 104) at approximately 2-5 μm below surface 118. The thickness of bottom implanted layer 110-3 may be approximately 0.5-2 μm. The distance between bottom implanted layer 110-3 and middle implanted layer 110-2 (i.e., n-doped region 120-2) may be approximately 0.5-3 μm in some examples.

A second ion implantation operation may be performed through thin oxide layer 122 to implant middle implanted layer 110-2 in block 212. In some examples, the second ion implantation operation may be performed while substrate 102 is tilted such that the ion beam impinges on thin oxide layer 122 at an angle other than 90 degrees, i.e., other than perpendicular. For example, substrate 102 may be tilted such that the ion beam impinges on thin oxide layer 122 at an angle that is approximately 3-10 degrees off from perpendicular. The second ion implantation operation may be performed using an ion implantation energy of approximately 0.5-3 MeV in some examples. Performing ion implantation through thin oxide layer 122 while tilting substrate 102, as described above, may result in middle implanted layer 110-2 having an approximately gaussian distribution doping profile.

Middle implanted layer 110-2 may be implanted in substrate 102 (i.e., in drain region 104) at approximately 0.5-3 μm below surface 118. The thickness of middle implanted layer 110-2 may be approximately 0.3-1.5 μm. The distance between middle implanted layer 110-2 and top implanted layer 110-1 (i.e., n-doped region 120-1) may be approximately 0.5-3 μm in some examples.

A third ion implantation operation through thin oxide layer 122 may be performed to implant top implanted layer 110-1 in block 214. In some examples, the third ion implantation operation may be performed while substrate 102 is tilted such that the ion beam impinges on thin oxide layer 122 at an angle other than 90 degrees, i.e., other than perpendicular. For example, substrate 102 may be tilted such that the ion beam impinges on thin oxide layer 122 at an angle that is approximately 3-10 degrees off from perpendicular. The third ion implantation operation may be performed using an ion implantation energy of approximately 50-500 keV in some examples. Performing ion implantation through thin oxide layer 122 while also tilting substrate 102, as described above, may result in top implanted layer 110-1 having an approximately gaussian distribution doping profile. The thickness of top implanted layer 110-1 may be approximately 0.1-1 μm. Accordingly, top implanted layer 110-1 may extend from surface 118 down into substrate 102 (i.e., into drain region 104) approximately 0.1-1 μm.

Figure 6:
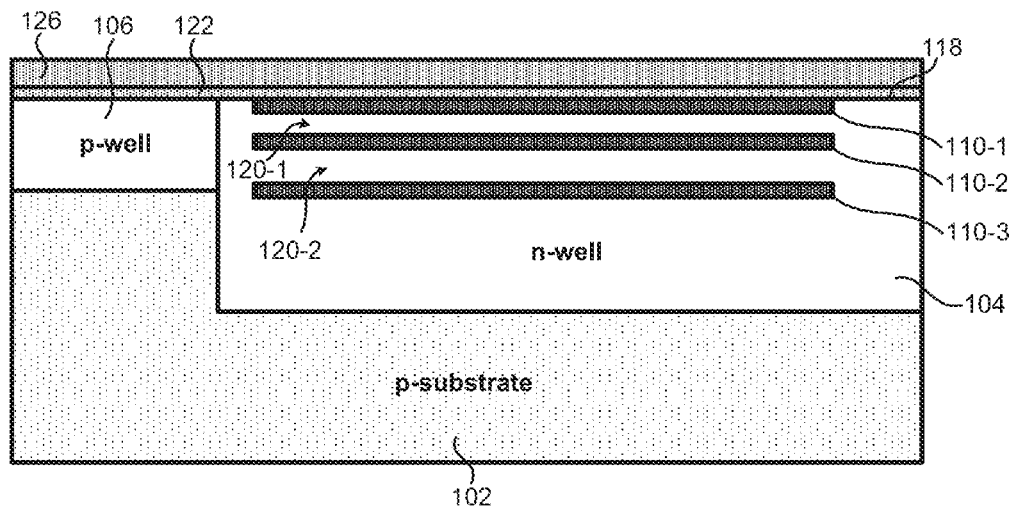
FIG. 6 shows a cross-sectional side view of a substrate including a thick oxide layer.

Referring now to FIG. 6, masking layer 134 may be removed from thin oxide layer 122. Subsequently, thick oxide layer 126 may be formed over top of thin oxide layer 122 in block 216. Thick oxide layer 126 may be formed using a low temperature oxide forming process, such as a chemical vapor deposition process in some examples. Using a low temperature process may prevent diffusion of implanted layers 110. In some examples, thick oxide layer 126 may have a thickness of approximately 0.1-2 μm.

Figure 7:
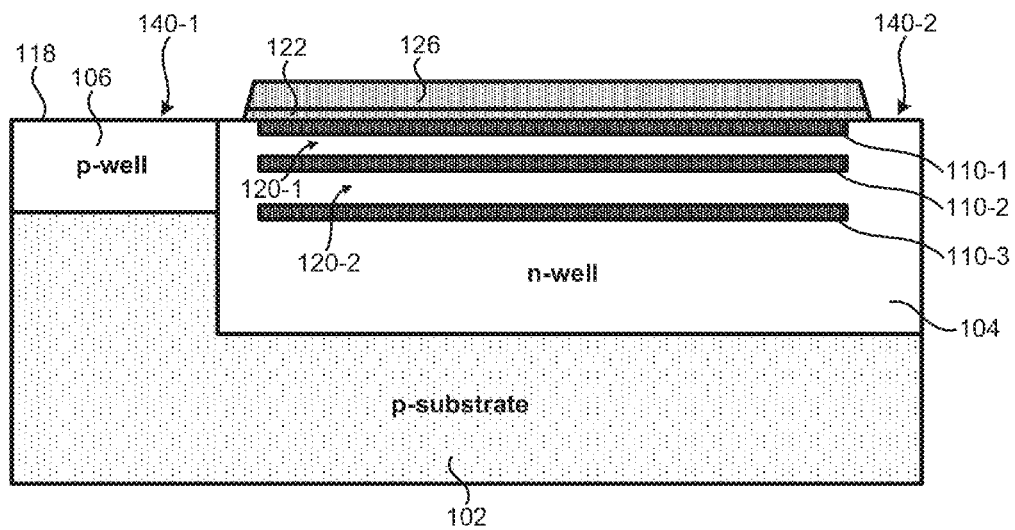
FIG. 7 shows a cross-sectional side view of a substrate including an etched thick oxide layer and an etched thin oxide layer.

Referring now to FIG. 7, thick oxide layer 126 and thin oxide layer 122 may be etched to expose regions 140-1, 140-2 of surface 118 in block 218. Exposed region 140-1 may be over top of body region 106. Exposed region 140-2 may be over top of drain region 104. Fabrication of the additional features of HVFET 100 are now described with respect to FIG. 1.

Referring back to FIG. 1, source region 108 and drain contact region 112 may be fabricated in block 224. Source region 108 may be formed using two doping operations. For example, P+ region 108-1 and N+ region 108-2 may be formed by using a p-doping process and an n-doping process, respectively. Drain contact region 112 may be formed using an N+ doping process.

Gate oxide layer 124 may be formed over body region 106 in block 220. Gate oxide layer 124 may be formed using a thermal oxidation process. Gate oxide layer 124 may have a thickness of approximately 10-100 nm in some examples.

Gate electrode 128 and drain polysilicon extension 130 may be formed in block 222 using a Low Pressure Chemical Vapor Deposition, LPCVD process. Gate electrode 128 and drain polysilicon extension 130 may include doped polysilicon in some examples. Gate electrode 128 may have a thickness of approximately 0.1-1 µm. Drain polysilicon extension 130 may have a thickness of approximately 0.1-1 µm.

Interlayer dielectric 132 may then be formed in block 226 using a Chemical Vapor Deposition, CVD process which is a low temperature process. Interlayer dielectric 132 may have a thickness of approximately 0.3-2 µm in some examples. Drain electrode 114 and source electrode 116 may be formed in block 228. In some examples, drain electrode 114 and source electrode 116 may be metallic electrodes.

Although a few examples have been described in detail above, other modifications are possible. For example, the flow diagram depicted in FIG. 2 does not require the particular order shown, or sequential order, to achieve desirable results. Other steps may be provided or eliminated in the described flow diagram. For example, the various regions of substrate 102 (e.g., 104, 106, 108, 110, 112) and various layers (e.g., 114, 116, 122, 124, 126, 128, 130, 132) of HVFET 100 may be fabricated in a different order than described with respect to FIG. 2. Additionally, it is contemplated that regions and/or layers may be added to substrate 102, or removed from substrate 102, to form an HVFET. Other embodiments may be within the scope of the claims.

FIG. 8 shows an alternative HVFET 800 that includes implanted layers 810-1, 810-2, 810-3 (collectively "implanted layers 810"). Alternative HVFET 800 differs from HVFET 100 in that implanted layers 810 are implanted at different depths within drain region 104 than implanted layers 110. For example, top implanted layer 810-1 may be implanted a distance away from surface 118 such that an n-doped region 820-1 is present between implanted layer 810-1 and surface 118.

Implanted layers 810 may be p-doped regions (e.g., using boron) within drain region 104. Implanted layers 810 may be implanted within drain region 104 using ion implantation operations as described above with respect to the ion implantation of implanted layers 110. Each of implanted layers 810 may have approximately planar geometries that extend within drain region 104 approximately parallel to surface 118.

Implanted layers 810 may be formed at different depths within drain region 104 such that implanted layers 810 are stacked above and below one another. Implanted layers 810 may be separated from one another by regions of the n-well that are not p-doped by the ion implantation operations. In other words, implanted layers 810 may be formed in drain region 104 such that implanted layers 810 are separated by n-doped regions 820-2, 820-3 of drain region 104. In HVFET 800, each of implanted layers 810 is surrounded by n-doped material of drain region 104.

The above description of illustrated examples of the present invention, including what is described in the Abstract, is not intended to be exhaustive or to be limiting to the precise forms disclosed. While specific embodiments of, and examples for, the invention are described herein for illustrative purposes, various equivalent modifications are possible without departing from the broader spirit and scope of the present invention. Indeed, it is appreciated that the specific example dimensions, voltages, currents, etc., are provided for explanation purposes and that other values may also be employed in other embodiments and examples in accordance with the teachings of the present disclosure.

What is claimed is:

1. A method for fabricating a high-voltage field-effect transistor with multiple implanted layers, the method comprising:
    forming a body region in a semiconductor substrate;
    forming a source region in the semiconductor substrate; and
    forming a drain region in the semiconductor substrate that may include a doped n-well region and is separated from the source region by the body region, wherein forming the drain region comprises:
        forming a first oxide layer on a surface of the semiconductor substrate over the drain region using a thermal oxidation process;
        forming a photoresist masking layer including an opening in the photoresist masking layer on top of the first oxide layer;
        performing a plurality of ion implantation operations through the opening in the photoresist masking layer and through the first oxide layer while tilting the semiconductor substrate such that ion beams impinge on the first oxide layer at an angle that is offset less than twenty degrees from perpendicular, wherein the plurality of ion implantation operations form a corresponding plurality of separate implanted layers with Gaussian doping profiles within the drain region, and wherein each of the implanted layers is formed at a different depth within the drain region;
        removing the photoresist masking layer from the top of the first oxide layer; and
        depositing a second oxide layer on top of the first oxide layer and above the implanted layers and the drain region of the high-voltage field-effect transistor using a low temperature oxide deposition process, wherein lateral bounds of the second oxide layer extend beyond the lateral bounds of the implant layers, and wherein the second oxide layer is thicker than the first oxide layer.

2. The method of claim 1, wherein the first oxide layer has a thickness of 20-500 nanometers.

3. The method of claim 1, wherein tilting the semiconductor substrate comprises tilting the semiconductor substrate such that ion beams impinge on the first oxide layer at an angle of three to ten degrees offset from perpendicular.

4. The method of claim 1, wherein the first oxide layer has a thickness of 20-500 nanometers, and wherein the second oxide layer has a thickness of 0.1-2 micrometers.

5. The method of claim 4, further comprising:
performing an etching process to expose the surface of the semiconductor substrate over top of the body region;
forming a gate oxide layer over top of the body region, wherein the gate oxide layer abuts the first oxide layer and the second oxide layer; and
forming a gate electrode over top of the gate oxide layer and a portion of the second oxide layer, wherein a portion of the gate electrode over the portion of the second oxide layer is located over top of portions of the implanted layers near the body region.

6. The method of claim 1, wherein each implanted layer of the plurality of separate implanted layers has a thickness of 0.1-2 micrometers.

7. The method of claim 1, wherein the drain region comprises an n-type well, wherein performing the plurality of ion implantation operations comprises performing three ion implantation operations to form three separate p-type implanted layers, wherein a first one of the p-type implanted layers is formed at the surface of the semiconductor substrate abutting the first oxide layer, wherein a second one of the p-type implanted layers is formed beneath the first one of the p-type implanted layers, and wherein a third one of the p-type implanted layers is formed below the second one of the p-type implanted layers.

8. The method of claim 7, wherein the first and second p-type implanted layers are separated by a first n-type region of the n-type well having a thickness of 0.5-3 micrometers, and wherein the second and third p-type implanted layers are separated by a second n-type region of the n-type well having a thickness of 0.5-3 micrometers.

9. The method of claim 1, wherein the drain region comprises an n-type well, wherein performing the plurality of ion implantation operations comprises performing three ion implantation operations to form three separate p-type implanted layers within the n-type well, wherein a first one of the p-type implanted layers is buried below the surface of the substrate such that an n-type region of the n-type well is disposed between the first oxide layer and the first p-type implanted layer, wherein a second one of the p-type implanted layers is formed below the first one of the p-type implanted layers, and wherein a third one of the p-type implanted layers is formed below the second one of the p-type implanted layers.

10. The method of claim 9, wherein the first p-type implanted layer is separated from the first oxide layer by a first n-type region of the n-type well having a thickness of 0.05-2 micrometers, wherein the first and second p-type implanted layers are separated by a second n-type region of the n-type well having a thickness of 0.5-3 micrometers, and wherein the second and third p-type implanted layers are separated by a third n-type region of the n-type well having a thickness of 0.5-3 micrometers.

11. A method for fabricating a high-voltage field-effect transistor with multiple implanted layers, the method comprising:
forming a body region in a semiconductor substrate;
forming a source region in the semiconductor substrate; and
forming a drain region in the semiconductor substrate that is separated from the source region by the body region, wherein forming the drain region comprises:
forming a first oxide layer on a surface of the semiconductor substrate over the drain region;
forming a photoresist masking layer including an opening in the photoresist masking layer on top of the first oxide layer;
performing three ion implantation operations through the opening in the photoresist masking layer and through the first oxide layer to form three separate implanted layers with Gaussian doping profiles within the drain region, wherein each of the implanted layers is deposited at a different depth within the drain region, and wherein a first one of the three implanted layers is located at the surface of the semiconductor substrate abutting the first oxide layer, wherein performing three ion implantation operations comprises tilting the semiconductor substrate such that ion beams impinge on the oxide layer at an angle that is offset less than twenty degrees from perpendicular; and
removing the photoresist masking layer from the top of first oxide layer; and
forming a second oxide layer on top of the first oxide layer and above the implanted layers and the drain region of the high-voltage field-effect transistor using a low temperature oxide deposition process, wherein the second oxide layer is thicker than the first oxide layer.

12. The method of claim 11, wherein the first oxide layer has a thickness of 20-500 nanometers, and wherein the second oxide layer has a thickness of 0.1-2 micrometers.

13. The method of claim 12, further comprising:
performing an etching process to expose the surface of the semiconductor substrate over top of the body region;
forming a gate oxide layer over top of the body region, wherein the gate oxide layer abuts the first oxide layer and the second oxide layer; and
forming a gate electrode over top of the gate oxide layer.

14. The method of claim 11, wherein each of the three implanted layers has a thickness of 0.1-2 micrometers.

15. The method of claim 11, wherein the drain region comprises an n-type well, wherein the three implanted layers are p-type implanted layers, wherein a second one of the p-type implanted layers is formed beneath the first one of the p-type implanted layers, and wherein a third one of the p-type implanted layers is formed below the second one of the p-type implanted layers.

16. The method of claim 15, wherein the first and second p-type implanted layers are separated by a first n-type region of the n-type well having a thickness of 0.5-3 micrometers, and wherein the second and third p-type implanted layers are separated by a second n-type region of the n-type well having a thickness of 0.5-3 micrometers.

17. A method for fabricating a high-voltage field-effect transistor with multiple implanted layers, the method comprising:
forming a body region in a semiconductor substrate;
forming a source region in the semiconductor substrate;
forming a drain region in the semiconductor substrate that is separated from the source region by the body region, wherein forming the drain region comprises:
forming a first oxide layer on a surface of the semiconductor substrate over the drain region, wherein the first oxide layer has a thickness of 20-500 nanometers;
forming a photoresist masking layer including an opening in the photoresist masking layer on top of the first oxide layer;
performing three ion implantation operations through the opening in the photoresist masking layer and through the first oxide layer to form three separate implanted layers with Gaussian doping profiles within the drain region such that ion beams impinge on the first oxide layer at an angle that is offset less than twenty degrees from perpendicular, wherein each of the implanted layers is deposited at a different depth within the drain region, and wherein each of the three separate implanted layers has a thickness of 0.1-2 micrometers; and removing the photoresist masking layer from the top of the first oxide layer;

forming a second oxide layer over top of the first oxide layer and above the implanted layers and the body region of the high-voltage field-effect transistor using a low temperature oxide deposition process, wherein the second oxide layer has a thickness of 0.1-2 micrometers, and wherein the second oxide layer is thicker than the first oxide layer;

forming a gate oxide layer on the surface of the semiconductor substrate over top of the body region, wherein the gate oxide layer abuts the first oxide layer and the second oxide layer; and forming a gate electrode over top of the gate oxide layer and a portion of the second oxide layer.

18. A method for fabricating a high-voltage field-effect transistor with multiple implanted layers, the method comprising:

forming a body region in a semiconductor substrate;

forming a source region in the semiconductor substrate; and forming a drain region in the semiconductor substrate that is separated from the source region by the body region, wherein forming the drain region comprises:

forming a first oxide layer on a surface of the semiconductor substrate over the drain region;

forming a photoresist masking layer including an opening in the photoresist masking layer on top of the first oxide layer;

performing a plurality of ion implantation operations through the opening in the photoresist masking layer and through the first oxide layer to form a plurality of implanted layers with Gaussian doping profiles within the drain region such that ion beams impinge on the first oxide layer at an angle that is offset less than twenty degrees from perpendicular, wherein each of the implanted layers is deposited at a different depth within the drain region, and wherein a first of the plurality of layers is located at the surface of the semiconductor substrate abutting the first oxide layer; and removing the photoresist masking layer from the top of the first oxide layer; and forming a second oxide layer on top of the first oxide layer and above the implanted layers and the body region of the high-voltage field-effect transistor using a low temperature oxide deposition process, wherein the second oxide layer is thicker than the first oxide layer.

19. The method of claim 18, further comprising forming a gate electrode disposed over the body region, and a drain extension disposed proximate to the drain region, wherein the gate electrode and the drain extension include doped polysilicon and are formed by low pressure chemical vapor deposition, wherein the gate electrode and the drain extension are 0.1-1 µm thick.

* * * * *